United States Patent [19]

Wieloch

[11] Patent Number: 5,610,493

[45] Date of Patent: Mar. 11, 1997

[54] TERMINAL CONFIGURATION FOR A MOTOR CONTROLLER

[75] Inventor: Christopher J. Wieloch, Brookfield, Wis.

[73] Assignee: Allen-Bradley Company, Inc., Milwaukee, Wis.

[21] Appl. No.: 420,547

[22] Filed: Apr. 12, 1995

[51] Int. Cl.$^6$ ........................................... H05K 7/14
[52] U.S. Cl. ...................... 318/801; 318/807; 361/600; 363/37
[58] Field of Search .................... 318/138, 254, 318/439, 768, 801, 808, 812, 807; 310/67 R, 68 D, 68 R, 227; 361/600, 709, 810; 363/37, 56, 141, 147

[56] References Cited

U.S. PATENT DOCUMENTS

| | | | |
|---|---|---|---|
| 4,668,898 | 5/1987 | Harms et al. ........................... | 318/254 |
| 4,996,470 | 2/1991 | Rowan .................................. | 318/772 |
| 5,008,608 | 4/1991 | Unsworth et al. ..................... | 318/729 |
| 5,187,419 | 2/1993 | DeLange .............................. | 318/805 |
| 5,313,150 | 5/1994 | Arakawa et al. ...................... | 318/768 |
| 5,497,289 | 3/1996 | Sugishima et al. .................... | 361/709 |

*Primary Examiner*—Bentsu Ro
*Attorney, Agent, or Firm*—Patrick S. Yoder; John M. Miller; John J. Horn

[57] ABSTRACT

A controller for driving an electric motor includes a rectifying circuit for converting AC power from a source to DC power, an inverting circuit coupled to the rectifying circuit via a DC bus for converting the DC power to controlled AC power in response to control signals and control circuitry for generating control signals for driving the inverting circuit in accordance with a preset control routine. The rectifying and inverting circuits are included in a power substrate module, while the control circuitry is included on a control circuit board separate from the power substrate module. The control circuit board is coupled to the power substrate module via a plurality of conducting pins and the controller circuitry is housed in an enclosure. A plurality of terminal conductors are supported on the control circuit board for transmitting power to and from the power substrate module via the conducting pins through the control circuit board. The terminal conductors terminate outside the enclosure for ready access and connection to phase conductors from the source and to the motor.

14 Claims, 6 Drawing Sheets

TERMINAL CONFIGURATION FOR A MOTOR CONTROLLER

BACKGROUND OF THE INVENTION

The present invention relates generally to a controller for AC motors. More particularly, the invention relates to a motor controller having a compact construction that can be easily coupled between a source of AC power and a motor via readily accessible input and output terminals anchored to a control circuit board within the controller.

In recent years the popularity of AC motor controllers, particularly variable frequency motor controllers, has grown tremendously. Such controllers find application in virtually all facets of industry, including material handling, manufacturing and process control. Also referred to as motor drive packages, these controllers are designed for installation between a source of AC power and the motor to be controlled and offer the engineer considerable flexibility in adapting the drive characteristics of the controller to the particular application on which the motor is installed. Once practical only on applications involving large motors using complex hard-wired relay circuits, sophisticated motor controllers are now commonly available for small AC motors as well. Moreover, the use of solid state programmable circuitry has permitted even small motor controllers to offer even greater flexibility in a compact and economical package.

Known AC motor controllers of this type, particularly controllers for smaller horsepower motors (e.g. 5 horsepower and below), generally include a number of solid state power components, such as rectifying circuitry and inverting circuitry, typically including insulated gate bipolar transistors (IGBT's), as well as lower voltage isolation, drive and monitoring circuits for driving the IGBT's and for monitoring certain operating parameters of the drive. In addition, such controllers include a logic circuit board supporting components such as a microprocessor, and a power supply board supporting circuitry for supplying power to the switching devices and logic circuitry. While the lower voltage logic circuitry is thus typically separated from the higher voltage components, it is common in the art to support both the input rectifying circuitry, the IGBT circuitry and the isolation, drive and monitoring circuitry on a single drive circuit board.

In operation, the controller is wired to input phase conductors and the rectifying circuit converts incoming AC power to DC power. The DC power is transmitted to the inverting circuit via a DC bus. The inverting circuit reconverts the DC power to AC power at controlled voltage, current and frequency in response to control signals generated by the logic control circuitry in accordance with preset control routines. The controlled AC power is then transmitted to the motor via output conductors to drive the motor.

In addition to the various components and circuitry, known motor controllers typically include a single input and output terminal strip for connection to incoming AC power conductors, to the motor being driven and to any external circuit components such as braking resistors and the like. The terminal strip is typically supported on the same drive circuit board as the power circuitry and incoming power is transmitted from the controller input terminals to the input rectifying circuit via conductor paths on the circuit board. Moreover, outgoing, controlled waveform AC power is transmitted from the inverting circuitry to the output terminals via similar conductor paths.

Several disadvantages are associated with this conventional configuration. First, the conductor paths used to route power to and from the power circuitry can lead to significant heating due to ohmic power losses. Moreover, routing the conductor paths and mounting the terminal strip on the drive circuit board substantially increases the footprint of the drive circuit board and, consequently, the physical size of the drive. Furthermore, because in the assembled drive package the drive circuit board is housed within an enclosure, such as a plastic cover, installation and servicing of the drive requires that the cover be repeatedly removed and replaced for access to the terminal strip. Finally, manipulation of the connectors on the terminal strip can cause movement of the drive circuit board, resulting in weakening or breaking connections between the board and other system components.

SUMMARY OF THE INVENTION

The present invention features a novel and innovative configuration for a motor controller that greatly facilitates installation of the drive by providing ready access to the input and output drive terminals and reduces power losses resulting from power transmission within the drive by routing power more directly from the terminals to a power substrate. Moreover, the arrangement in accordance with one aspect of the invention significantly reduces mechanical stresses on the circuit boards comprising the drive by routing incoming and outgoing power through terminals supported by the drive housing.

Thus, in accordance with a first aspect of the invention, a controller for regulating the output characteristics of an electric motor includes a power substrate module, a control circuit board and a plurality of input and output terminal conductors. The power substrate module includes a rectifying circuit and an inverting circuit coupled to the rectifying circuit via a direct current bus. The rectifying circuit converts alternating current (AC) power from a source of electrical power to direct current (DC) power, while the inverting circuit converts the DC power to controlled AC power to drive the electric motor in response to control signals. The control circuit board is separate from the power substrate module and is coupled to the power substrate module via a plurality of conducting pins. The control circuit board includes a drive circuit for generating control signals to drive the inverting circuit. The terminal conductors are coupled to the control circuit board and transmit power from the source to the rectifying circuit and from the inverting circuit to the motor via the control circuit board.

In a particularly preferred arrangement, a motor controller includes a housing, drive circuitry and a plurality of terminal conductors. The drive circuitry is enclosed within the housing and includes a rectifying circuit, an inverting circuit and a control circuit. The rectifying circuit converts AC power to DC power, while the inverting circuit converts the DC power to controlled AC power in response to control signals from the control circuit. The terminal conductors extend from the drive circuitry to terminal points outside the housing for coupling to a source of alternating current power and to the motor.

These and other advantageous features of the invention are decribed in greater detail below.

BRIEF DESCRIPTION OF THE DRAWINGS

The present invention will become more fully understood from the following detailed description, taken in conjunction with the accompanying drawings, wherein like reference numerals refer to like parts, in which.

DESCRIPTION OF THE PREFERRED EMBODIMENTS

Figure 1:
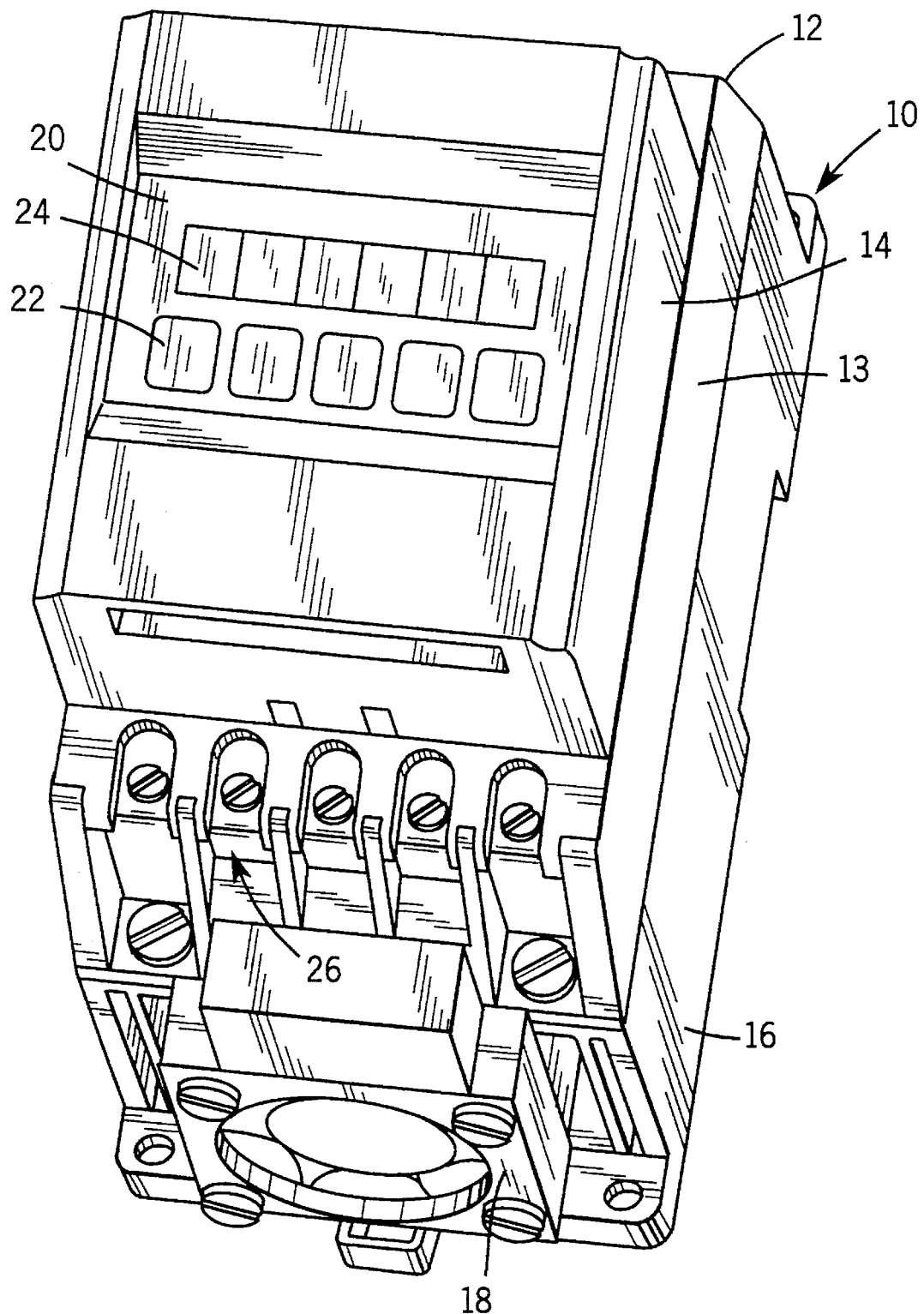
FIG. 1 is perspective view of a motor controller package in accordance with an exemplary embodiment of the present invention.

Turning now to the drawings and referring to FIG. 1, an assembled motor controller or drive 10 includes a housing or enclosure 12 comprising a base 13 and a cover 14 containing power, drive and control circuitry as described in detail below. Enclosure 12 is preferably supported on a heat sink mount 16, including a cooling fan 18, for dissipating heat generated by operation of controller 10. Upon installation of controller 10, heat sink mount 16 is attached to a convenient location, such as within a wiring enclosure. Moreover, where a sufficiently heat dissipative surface is available for mounting controller 10, heat sink mount 16 may be removed.

As illustrated in FIG. 1, controller 10 includes a human interface 20 supported in cover 14. Interface 20 includes keys 22 for inputting desired parameter values, configuring controller 10 and verifying the controller configuration. Interface 20 also includes a visual display 24 for indicating to an operator various parameters and configuration codes input or accessed by operation of keys 22.

Figure 2:
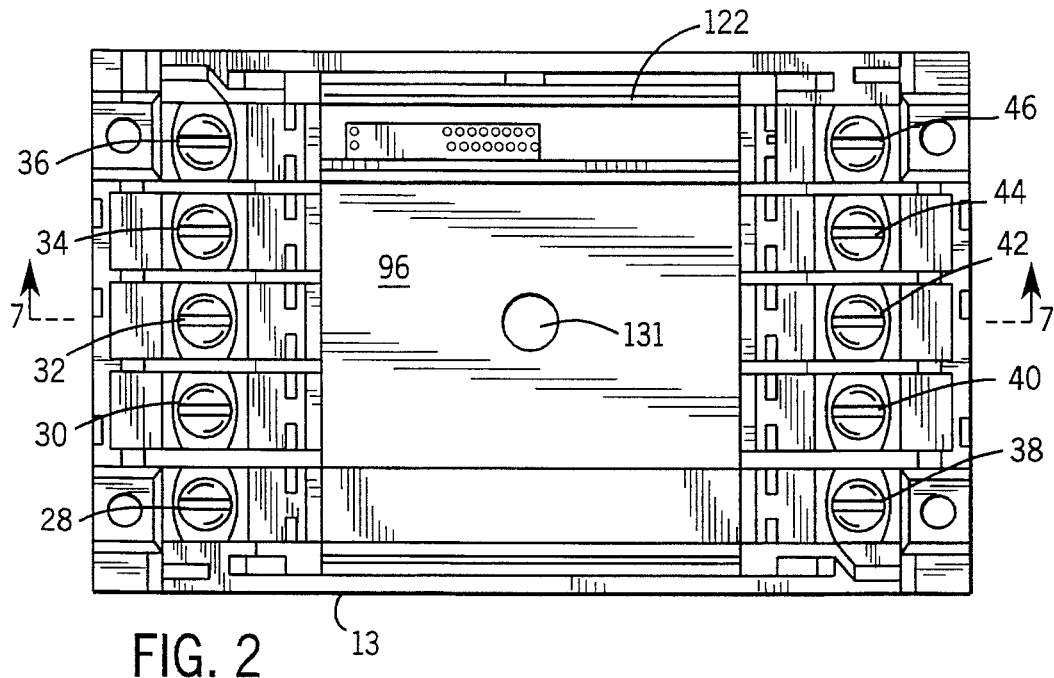
FIG. 2 is a top plan view of the motor controller illustrated in FIG. 1, showing the configuration of the input and output terminals with respect to the controller housing.

Controller 10 also includes a plurality of terminals, designated generally by the reference numeral 26. FIG. 2, which is a top plan view of controller 10 wherein cover 14 and a logic circuit board (described below) have been removed, more clearly shows these terminal locations. As shown in FIG. 2, ten such terminals are provided in a preferred embodiment of controller 10, including: incoming phase terminals 28, 30, 32; external brake resistor terminals 34, 36; outgoing phase terminals 38, 40, 42; and external capacitor terminals 44, 46. It will be noted that terminals 26 are provided on the outside of enclosure 12. This configuration facilitates coupling controller 10 to a source of AC power, to a motor to be controlled and to external brake resistors and capacitors by eliminating the need to remove a controller cover to access a terminal strip as on heretofore known controllers of this type. It will also be noted that incoming power terminals 28, 30, 32 are disposed on a first end of controller 10, while outgoing power terminals 38, 40, 42 are disposed on a second end opposite the first end. This arrangement also facilitates wiring of controller 10 to incoming and outgoing phase conductors by permitting controller 10 to be placed in an "in-line" orientation within a control cabinet or enclosure.

Figure 3:
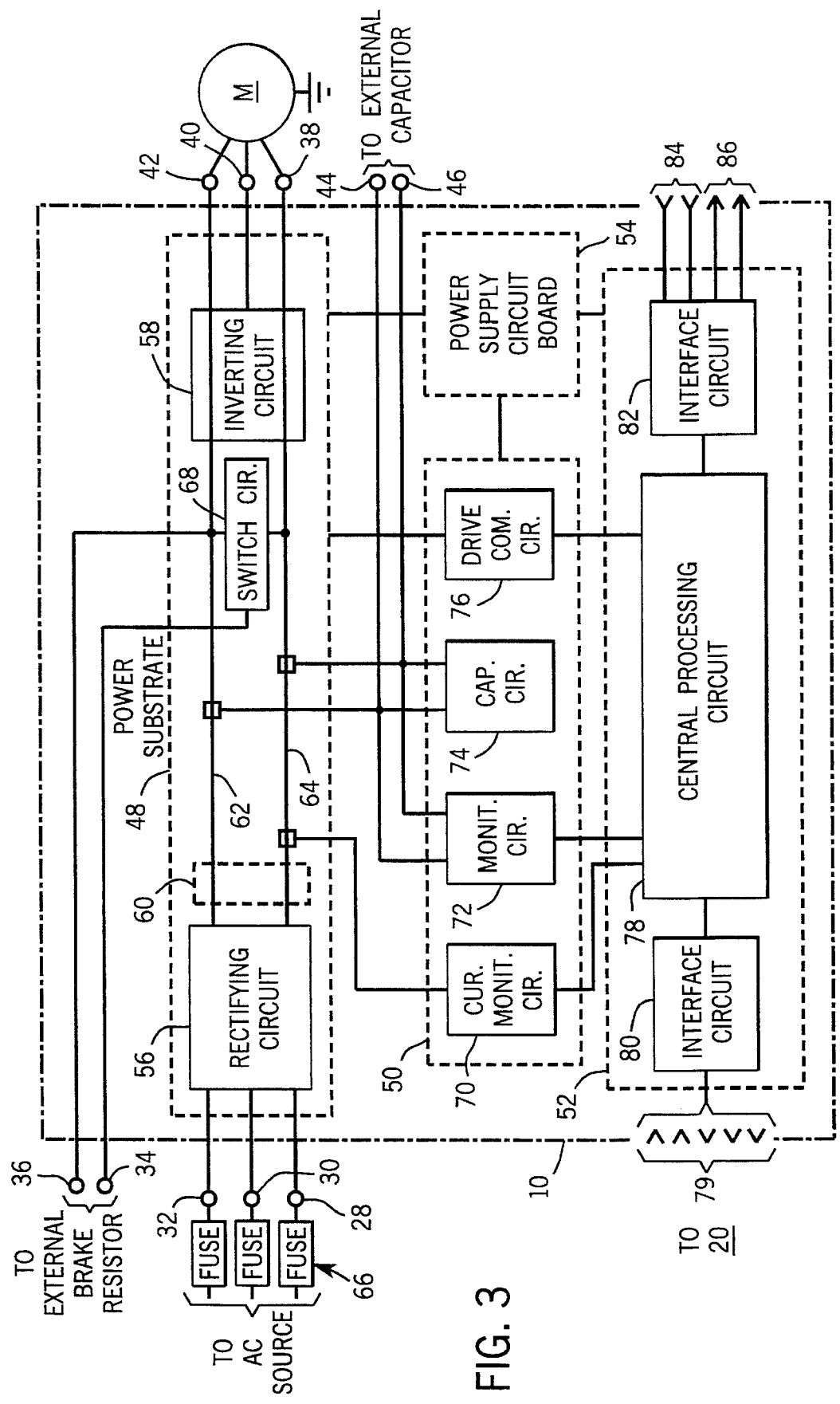
FIG. 3 is a diagrammatical illustration of the motor controller of FIG. 1, wherein various circuits comprising the controller and interconnections between the circuits are represented schematically.
Figure 4:
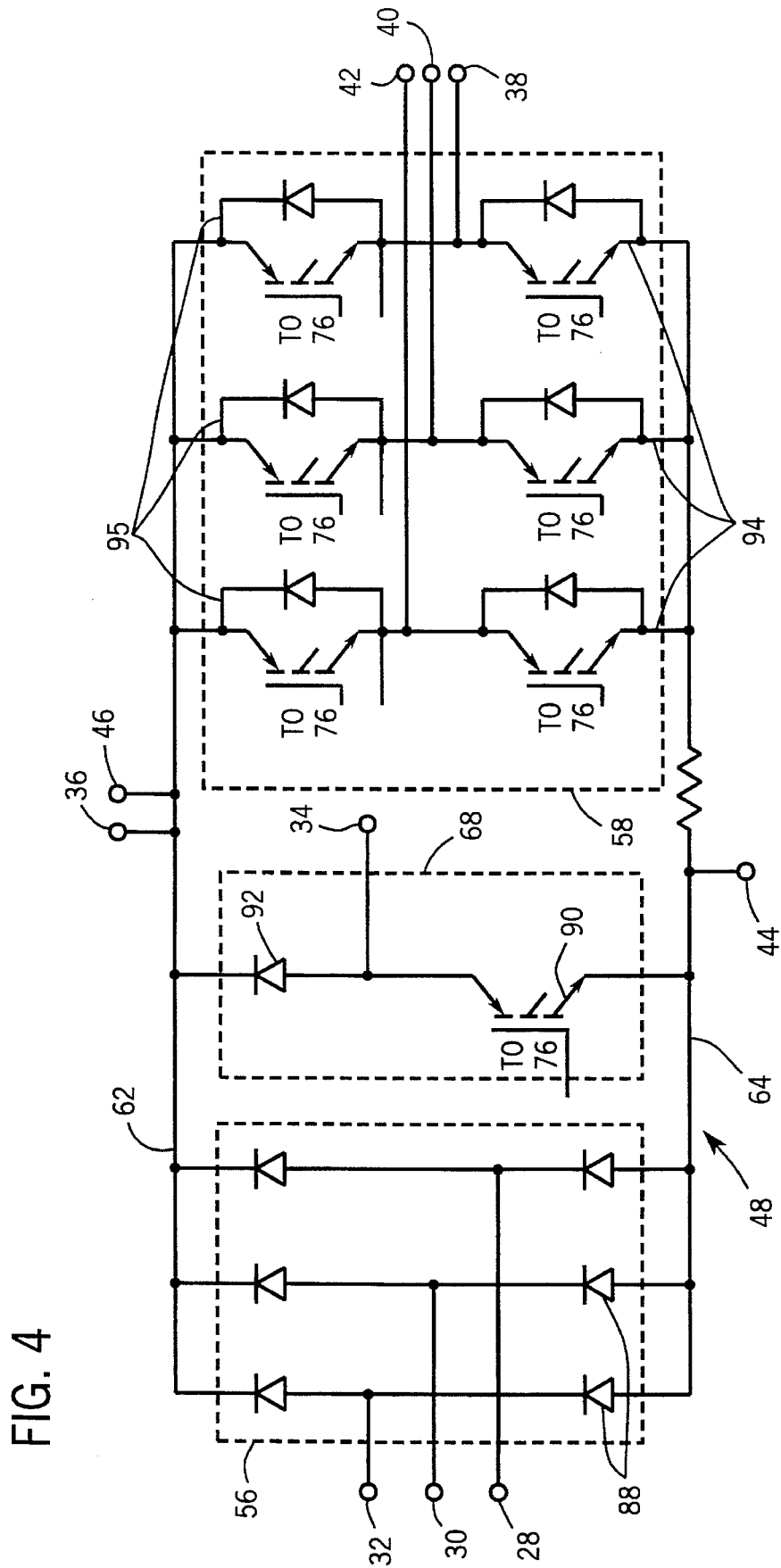
FIG. 4 is a schematic illustration of circuits supported on a power substrate module of the motor controller of FIG. 1.

As illustrated diagrammatically in FIGS. 3 and 4, controller 10 includes a number of interconnected circuits within a unitary drive package. As shown in FIG. 3, controller 10 includes a power substrate module 48, a control circuit board 50, a logic circuit board 52 and a power supply circuit board 54. Each of these circuit boards supports various circuit components interconnected by conducting paths to form the functional circuits described below. The internal configurations of the individual circuits included on these circuit boards are of types generally known in the art, such as the circuits incorporated in the Bulletin 1305 motor drives available from the Allen-Bradley Company of Milwaukee, Wis.

Power substrate module 48 includes a rectifying circuit 56 and an inverting circuit 58 coupled by an internal DC bus 60 having a high voltage side 62 and a low voltage side 64. Upon installation of controller 10, rectifying circuit 56 is coupled to a source of AC power via incoming phase terminals 28, 30, 32 through suitable overload, overcurrent and short circuit protective devices such as fuses 66. Rectifying circuit 56 converts incoming AC power to DC power which is output on DC bus 60. Inverting circuit 58, in turn, converts the DC power from bus 60 to controlled AC power in response to drive command signals from a drive command circuit 76 as described below. This controlled AC power is applied to output terminals 38, 40, 42 to control the performance of a motor M coupled to the output terminals. In addition, a switching circuit 68 is coupled between high and low sides 62 and 64 of DC bus 60 for dissipating energy through an external brake resistor (not shown) coupled to terminals 34 and 36.

Control circuit board 50 includes circuits for monitoring certain operating parameters associated with motor M or controller 10, as well as for convening control signals from logic circuit board 52 to drive command signals for controlling the operation of inverting circuit 58. Thus, control circuit board 50 includes a current monitoring circuit 70 coupled to low side 64 of DC bus 60 for continuously detecting the current through bus 60. Similarly, a voltage monitoring circuit 72 is coupled to both high and low sides 62 and 64 of DC bus 60 and continuously detects the voltage across bus 60. Additional monitoring circuits, such as a temperature monitoring circuit, may also be included on control circuit board 50. Control circuit board 50 also supports a capacitive circuit 74 including capacitors coupled across DC bus 60 for storing energy during operation of controller 10. In addition, control circuit board 50 includes drive command circuit 76 which generates drive command signals for controlling inverting circuit 58.

Logic circuit board 52 includes a central processing circuit 78 configured to monitor operation of controller 10 and to generate control signals for regulating the performance of motor M. Central processing circuit 78 preferably includes a programmed microprocessor and, internal or external to the microprocessor, an analog-to-digital converter, memory circuitry and signal processing circuitry for storing and executing a predetermined cyclic control routine for driving motor M. Central processing circuit 78 is coupled to monitoring circuits 70 and 72 and receives signals representative of the DC bus current and voltage from the monitoring circuits. These signals are converted to digital values at a predetermined sampling interval for use in the cyclic control routine implemented by circuit 78. Central processing circuit 78 is also coupled to drive command circuit 76 and communicates control signals to drive command circuit 76 for driving motor M.

In addition to inputs from current and voltage monitoring circuits 70 and 72, logic circuit board 52 is typically coupled to a number of input and output channels, designated generally by reference numeral 79. Central processing circuit 78 uses channels 79 to receive incoming signals from interface 20 and from such external elements as start and stop circuits, reverse and jog switches, and the like, and to output display data for display 24. Input and output signals through channels 79 are preferably communicated to central processing circuit 78 via an interface circuit 80 that includes opto-isolation for protecting control circuit 34 from power surges. Moreover, central processing circuit 78 receives input signals through one or more ports 84. For example, one such port 84 may be coupled to a potentiometer (not shown) for generating and supplying controller 10 with a target or desired drive signal frequency or motor output speed. Other ports 84 may be provided for various programming and control interface devices, such as a hand-held human interface module (not shown) or remote digital computer link. One or more output or monitoring ports 86 are preferably linked to central processing circuit 78, along with appropriate analog circuitry, for selectively monitoring the various operating parameters of controller 10, such as the desired and actual drive signal frequency or motor speed. Interface circuitry, designated generally at 82, is provided for isolating and conditioning the signals communicated to and from central processing circuit 78 through ports 84 and 86.

The principal functional elements of the circuits included in power substrate module 48 are illustrated schematically in FIG. 4. As shown, rectifying circuit 56 includes a plurality of diodes 88 coupled to input terminals 28, 30, 32 and to the high and low sides 62, 64 of DC bus 60 to form a full wave rectifier. Switching circuit 68 includes a switching device 90, such as an IGBT, and a diode 92. Brake resistor terminal 34 is coupled between switching device 90 and diode 92, while second brake resistor terminal 36 is coupled to the high voltage side 62 of DC bus 60. Switching device 90 is coupled to central processing circuit 78 through drive command circuit 76 and responds to switching signals from circuit 78 to permit current flow from the high voltage side 62 of DC bus 60, through an external resistor coupled to terminals 34 and 36 to the low voltage side 64 of DC bus 60. Thus, central processing circuit 78 can apply dynamic braking of motor M by actuation of switching device 90.

Inverting circuit 58 includes three pairs of switching devices, each pair including a high side device 95 and a low side device 94. Each high and low side switching device 95, 94 in turn includes an IGBT and a diode coupled between the transistor's emitter and collector. Moreover, in each pair of switching devices, the collector of the high side device 95 is coupled to the high side 62 of the DC bus. The emitter of the high side device 95 is coupled to the collector of the low side device 94 and the emitter of the low side device 94 is coupled to the low side 64 of the DC bus. Each switching device is coupled to a suitable power source, such as an 18 volt source originating on power supply board 54 or to a capacitor charge pump circuit (not shown), as well as to central processing circuit 78 through drive command circuit 76. Output terminals 38, 40 and 42 are coupled between the pairs of switching devices. Devices 94 and 95 are directed to conduct between the output terminals and the DC bus low side 64 and between the DC bus high side 62 and the output terminals, respectively, in response to drive control signals from drive command circuit 76. These drive control signals are based upon logic control signals from central processing circuit 78. Thus, central processing circuit 78 directs switching devices 94 and 95 to convert DC power from DC bus 60 to AC power that is output through terminals 38, 40 and 42.

In operation, controller 10 drives motor M as follows. The memory circuitry of central processing circuit 78 (or memory external to circuit 78) stores a cyclic control routine including features such as ramped acceleration, ramped deceleration, characteristic speed curves for particular applications, such as for pump drive applications, and so on. Such control routines are generally known in the art, such as the routines implemented in the Bulletin 1305 drives from the Allen-Bradley Company of Milwaukee, Wis. In addition, calibration values and operating parameters, such as desired speed or frequency may be input to central processing circuit 78 via a manual or computer networked interface, such as through input keys 22 and ports 84. Based upon these values and the preset control routine, central processing circuit 78 generates logic control signals and applies them to drive command circuit 76. Drive command circuit 76 in turn generates drive control signals and applies them to inverting circuit 58. The logic and drive control signals direct the switching devices of inverting circuit 58 to switch off and on so as to convert the DC power in DC bus 60 to AC power in the form of adjustable frequency pulse-width-modulated drive signals for driving motor M at a desired speed. This controlled AC power is applied to motor M via terminals 38, 40 and 42.

Figure 5:
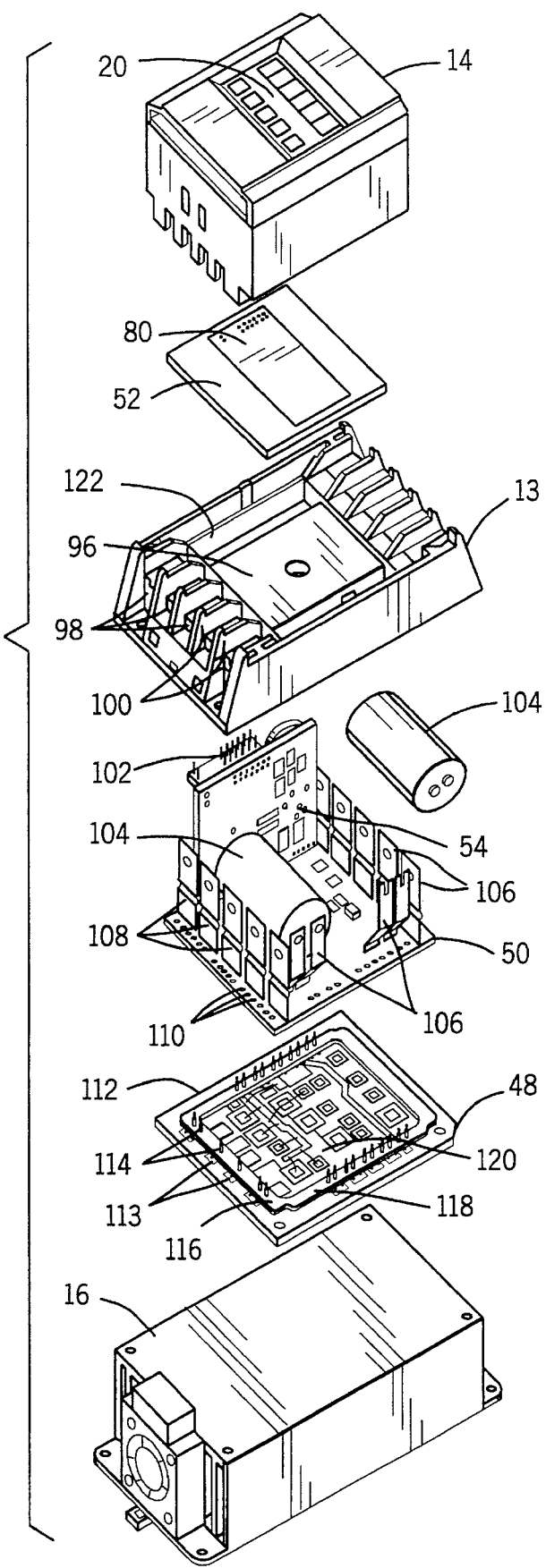
FIG. 5 is an exploded perspective of the circuit board and housing subassemblies of the motor controller shown in FIG. 1.

The preferred configuration of the various circuit boards included in controller 10 will now be described in greater detail, with particular reference to FIGS. 5 through 8. FIG. 5 is an exploded perspective view of the principal subassemblies of controller 10. As illustrated, logic circuit board 52, supporting interface circuit 80, is fitted within cover 14 above base 13. Base 13 includes a support surface 96 for supporting logic circuit board 52, as well as terminal bays 98 separated by partitions 100. Logic circuit board 52 is mounted on power supply board 54 and operationally coupled to power supply board 54 and to control circuit board 50 via a plurality of conducting pins 102 extending from the upper end of board 54.

Below support surface 96, control circuit board 50 supports power supply board 54 as well as two pairs of conductors 106 for transmitting electrical energy to capacitors 104 forming pan of capacitive circuit 74. Because control circuit board 50 is located below support surface 96 and capacitors 104 are positioned above surface 96, capacitors 104 are mounted in the controller after insertion of control circuit board 50 in base 13. Control circuit board 50 is typically a hybrid type circuit board structure formed on an epoxy-fiberglass substrate material by generally known techniques. In addition to the various circuit components and conductive paths provided on control circuit board 50 to define the circuits described above, conductive pads are formed on board 50 for terminal conductors 108. During assembly of controller 10, terminal conductors 108 are inserted into pin connection apertures, shown generally at 110, in control circuit board 50 and are joined to board 50 by a wave soldering or similar operation.

Figure 7:
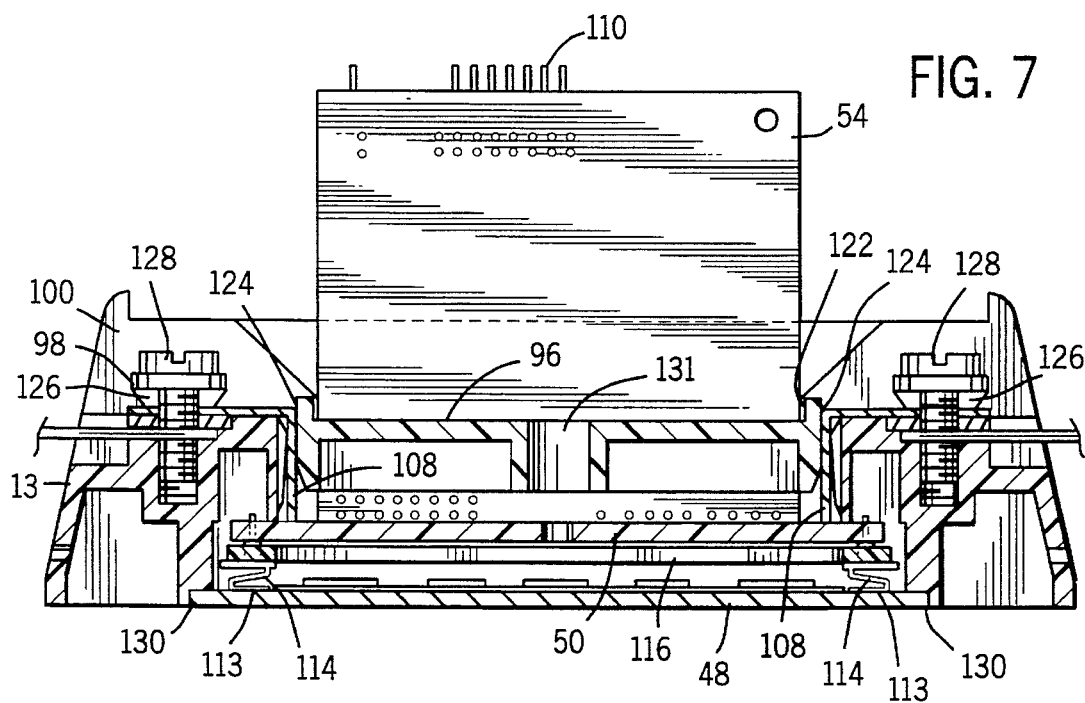
FIG. 7 is a partial sectional view of a portion of the controller along section 7—7 of FIG. 2, illustrating the internal configuration of the assembled controller package.
Figure 8:
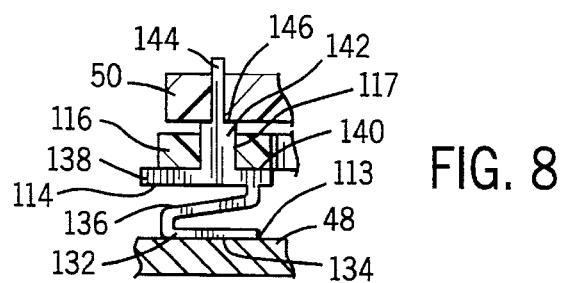
FIG. 8 is a detail view of a conductor disposed between the power substrate module and the control circuit board of the motor controller illustrated in FIG. 7.
Figure 6:
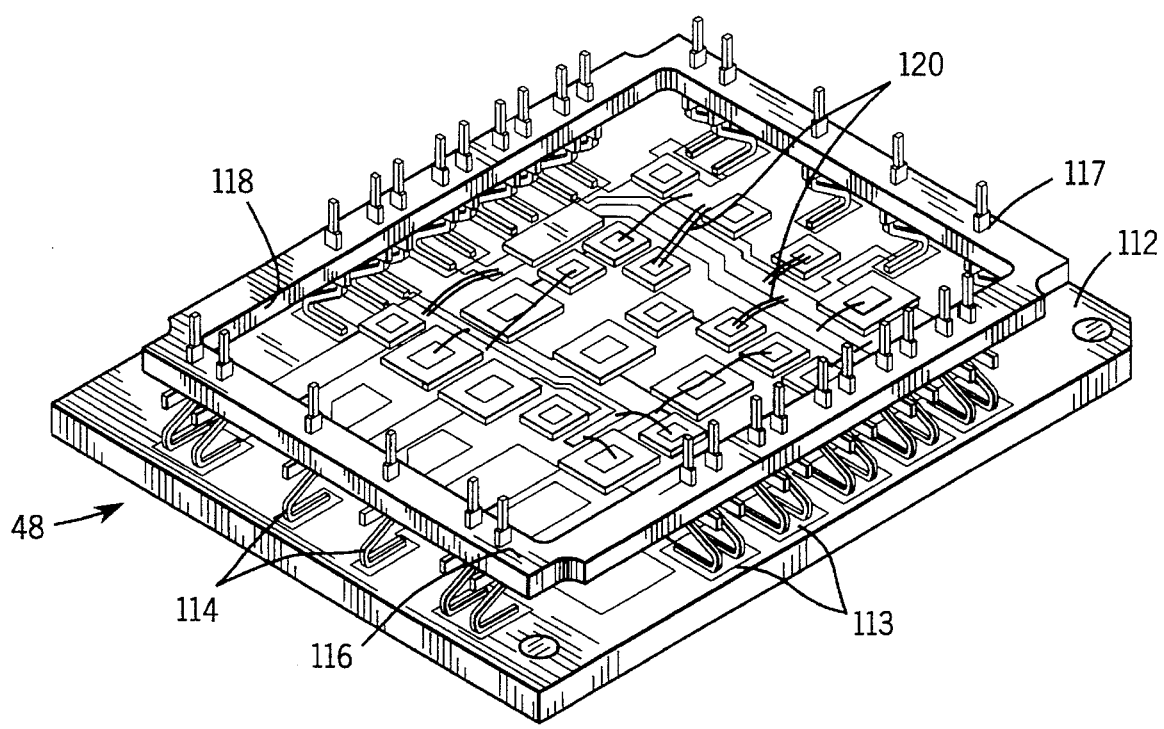
FIG. 6 is a perspective view of the power substrate module associated with the motor controller of FIG. 1 prior to assembly of the completed controller package.

Power substrate module 48 includes circuit components interconnected by conducting paths to form the functional circuits described above. Module 48 is preferably formed on a layered substrate material 112 having a lower aluminum base, an insulating layer overlying the base and a conductive layer overlying the insulating layer. During fabrication of module 48, the upper conductive layer of substrate material 112 is masked and etched by generally known techniques to form any conducting paths required between components as well as conducting pads 113 for transmitting AC power and drive signals to the module circuitry and controlled AC power from the circuitry. As best illustrated in FIGS. 6 through 8 and as discussed in greater detail below, power substrate module 48 is coupled to control circuit board 50 by conductors 114 that are anchored to conducting pads 113. A fixture 116 is positioned between power substrate module 48 and control circuit board 50 and includes conductor engaging apertures 117 through which conductors 114 extend. Fixture 116 is preferably constructed in a ring-like configuration surrounding a central opening 118, permitting wire connections 120 to be installed between components of the module circuitry after attachment of conductors 114 as described below.

Following fabrication of the subassemblies illustrated in FIG. 5, controller 10 is assembled as follows. With power supply board 54 already mounted to control circuit board 50, power substrate module 48 is coupled to control circuit board 50 by inserting a portion of conductors 114 through corresponding pin connection apertures 110 on board 50 and soldering conductors 114 to conductive pads surrounding each aperture in a conventional manner. Module 48, board 50 and board 54 are then inserted into base 13. A power supply passage 122 and terminal conductor passages 124 (see FIG. 7) are formed in base 13 so that power supply board 54 and terminal conductors 108 may extend through base 13 as controller 10 is assembled. It should be noted that, although not specifically shown in the FIGURES, similar passages are provided for capacitor conductors 106 (shown in FIG. 5). Prior to fully engaging these boards in base 13, an adhesive is applied around the periphery of power substrate module 48. The board assembly is then pressed into base 13 and terminal conductors 108 are bent over terminal points 126 within each terminal bay 98 and between partitions 100. Terminal screws 128 are inserted into base 13 through terminal conductors 108. To complete assembly, capacitors 104 are mounted on conductors 106 (not shown in FIGS. 2 or 7), logic circuit board 52 is coupled to pins 102 on power supply board 54 and cover 14 placed over base 13 with interface circuit 80 positioned between interface 20 and logic circuit board 52. Thus assembled, power substrate module 48 is adhesively held within an attachment recess 130 within base 13.

Prior to final assembly of controller 10, a silicon-based thermal gel of a type generally known in the art is preferably added, such as through a hole 13 1 provided through support surface 96 of base 13. A sufficient quantity of thermal gel is forced into base 13 to cover power substrate module 48, fill the volume between module 48 and control circuit board 50 and cover board 50. The addition of this thermal gel allows the environments of power substrate module 48 and control circuit board 50 to be classified such that the component and conductive path spacing on module 48 and board 50 may be minimized in accordance with industry creepage and clearance specifications. Moreover, the separation of the higher voltage circuitry supported on power substrate module 48 from the lower voltage circuitry supported on control circuit board 50 places these two subassemblies in different classifications for the purposes of minimum creepage and clearance distances. As a result, the circuitry on board 50 can be more tightly packed than that on module 48 or than it could otherwise be packed if mounted on a common substrate with the circuitry on module 48.

The structure and assembly of power substrate module 48, conductors 114 and fixture 116 will now be described in greater detail with particular reference to FIGS. 6, 7 and 8. As best illustrated in FIG. 8, conductors 114 include a base portion 132 having a lower edge contacting surface 134. Extending at an angle from base portion 132 is a stress relief section 136. Stress relief section 136 joins an upper portion 138 having an upper shoulder 140. A fixture engaging portion 142 extends upwardly from shoulder 140 and conductor 114 terminates in a contacting pin joining a step 146 on the upper end of fixture engaging portion 142. While alternative configurations for conductors 114 may be envisioned, the foregoing structure facilitates connection of conductors 114 to power substrate module 48.

Assembly of power substrate module 48, conductors 114 and fixture 116 proceeds as follows. Power substrate module 48 is first prepared by conventional techniques, such as by etching its upper conductive layer and attaching circuit components at appropriate locations on the substrate material. A suitable solder material is deposited on each conducting pad 113 for later connection of conductors 114. Fixture 116 is formed separately, preferably from an epoxy-fiberglass laminate material. During formation of fixture 116, conductor engaging apertures 117 are pierced or otherwise formed at locations corresponding to the desired locations of conductors 114. Apertures 117 are preferably of similar geometry and slightly smaller than the fixture engaging portion of conductors 114, such that conductors 114 are press fitted into apertures 117 and solidly retained within fixture 116 during assembly. Conductors 114 are then pressed into apertures 117. The fixture is positioned over substrate module 48 with each conductor overlying the appropriate conducting pad 113; and the entire assembly is passed through a reflow oven to melt the solder on pads 113 and connect conductors 114 to module 48. This series of fabrication and assembly steps is preferably carried out on an automated assembly line of a type generally known in the art.

It will be noted that as conductors 114 are inserted into apertures 117, the upper shoulder 140 of each conductor 114 will contact the lower face of fixture 116, effectively limiting the insertion of conductor 114 into fixture 116 and properly locating conductors 114 at a uniform level with respect to fixture 116. Similarly, as control circuit board 50 is installed on contacting pins 144 as described above, steps 146 limit the downward movement of board 50 on pins 144 and support board 50 at a uniform level above module 48.

To complete power substrate module 48, prior to assembly with control circuit board 50, wire connections can be made between various components of the module circuitry, such as by wire bonding. To facilitate such later process steps, fixture 116 preferably does not completely cover module 48, but extends only over certain portions of module 48. Thus, fixture 116 may comprise one of more strips of material, an open ring or, in the presently preferred embodiment illustrated, a closed ring structure overlying only the periphery of module 48.

I claim:

1. A controller for regulating the output characteristics of an electric motor comprising:

a power substrate module including a rectifying circuit for converting alternating current power from a source of electrical power to direct current power and an inverting circuit coupled to the rectifying circuit via a direct current bus, the inverting circuit converting the direct current power to controlled alternating current power to drive the electric motor in response to control signals;

a control circuit board separate from the power substrate module and coupled to the power substrate module via a plurality of conducting pins, the control circuit board being supported on the power substrate module at least partially by the conducting pins, the control circuit board including a drive circuit for generating the control signals to drive the inverting circuit; and a plurality of input and output terminal conductors supported on the control circuit board and coupled to the plurality of conducting pins, whereby when the controller is installed between the source and the motor, power is transmitted from the source to the rectifying circuit and from the inverting circuit to the motor via the terminal conductors and the plurality of conducting pins.

2. The controller of claim 1, further comprising a housing having an inside and an outside and enclosing at least the control circuit board and the power substrate module on the inside thereof, and wherein the terminal conductors terminate on the outside of the housing.

3. The controller of claim 1, wherein the power substrate module further includes a braking circuit and the terminal conductors include at least one conductor for coupling an external braking resistor to the braking circuit.

4. The controller of claim 1, wherein the terminal conductors include a pair of conductors for coupling an external capacitor to the direct current bus.

5. A controller for driving an alternating current electric motor comprising:

a housing having an inside and an outside;

drive circuitry enclosed within the housing, the drive circuitry including a rectifying circuit for converting alternating current power from a source of alternating current power to direct current power, an inverting circuit coupled to the rectifying circuit for converting the direct current power to controlled alternating current power in response to control signals and a control circuit for generating the control signals to drive the inverting circuit; and a plurality of terminal conductors extending from the drive circuitry to terminal points outside the housing for coupling to the source of alternating current power and to the motor.

6. The controller of claim 5, wherein the control circuit is supported on a control circuit board and the terminal conductors are coupled to the rectifying circuit and to the inverting circuit via the control circuit board.

7. The controller of claim 5, wherein each of the terminal conductors extends to a separate terminal point on the outside of the housing and wherein at each terminal point the respective conductor includes a tab having an aperture for receiving a securing device.

8. The controller of claim 5, wherein the housing has first and second ends and wherein terminal points of the terminal conductors for coupling the drive circuitry to the source of alternating current power are located on the first end of the housing and the terminal points of the terminal conductors for coupling the drive circuitry to the motor are located on the second end of the housing.

9. The controller of claim 5, wherein the housing includes a cover overlying at least a portion of the drive circuitry, the cover having a plurality of apertures formed therein for passage of the terminal conductors.

10. A controller for regulating the output characteristics of an electric motor comprising:

a power substrate module including circuitry for converting electrical power from a source to controlled alternating current power in response to control signals;

a control circuit board coupled to the power substrate module via a plurality of conductors, the control circuit board supporting the circuitry for generating the control signals;

a base unit supporting the power substrate module and the control circuit board;

a housing cover unit disposed over at least a portion of the base unit; and a plurality of terminal conductors electrically coupled to the power substrate module for transmitting the power to and from the power substrate module, the terminal conductors extending through the base unit to permit coupling of the controller to the source and to the motor without removal of the housing cover unit.

11. The controller of claim 10, wherein the control circuit board is supported on the power substrate module at least partially by the conductors.

12. The controller of claim 10, wherein the terminal conductors for coupling the controller to the source are disposed on a first end of the base unit and terminal conductors for coupling the controller to the motor are disposed on a second end of the base unit.

13. The controller of claim 10, wherein the terminal conductors extend through apertures in the base unit and receive terminal connectors for coupling the terminal conductors to the source and to the motor.

14. The controller of claim 10, wherein the terminal conductors are secured to the control circuit board and are electrically coupled to the power substrate module via pin connectors.

* * * * *